(12) United States Patent
Setlur et al.

(10) Patent No.: US 10,230,022 B2
(45) Date of Patent: Mar. 12, 2019

(54) LIGHTING APPARATUS INCLUDING COLOR STABLE RED EMITTING PHOSPHORS AND QUANTUM DOTS

(71) Applicant: General Electric Company, Schenectady, NY (US)

(72) Inventors: Anant Achyut Setlur, Niskayuna, NY (US); James Edward Murphy, Niskayuna, NY (US); Florencio Garcia, Schenectady, NY (US); Srinivas Prasad Sista, Altamont, NY (US)

(73) Assignee: General Electric Company, Schnectady, NY (US)

( * ) Notice: Subject to any disclaimer, the term of this patent is extended or adjusted under 35 U.S.C. 154(b) by 166 days.

(21) Appl. No.: 14/962,624

(22) Filed: Dec. 8, 2015

(65) Prior Publication Data

US 2016/0093776 A1   Mar. 31, 2016

Related U.S. Application Data

(63) Continuation-in-part of application No. 14/208,592, filed on Mar. 13, 2014, now Pat. No. 9,698,314.

(51) Int. Cl.
*C09K 11/61* (2006.01)
*C09K 11/02* (2006.01)
(Continued)

(52) U.S. Cl.
CPC .......... *H01L 33/502* (2013.01); *C09K 11/616* (2013.01); *C09K 11/617* (2013.01);
(Continued)

(58) Field of Classification Search
CPC ... H01L 33/502; H01L 33/504; H01L 33/507; H01L 33/52; C09K 11/616;
(Continued)

(56) References Cited

U.S. PATENT DOCUMENTS 2,522,074 A   9/1950   Urbach
3,576,756 A   4/1971   Russo
(Continued)

FOREIGN PATENT DOCUMENTS

CN   102827601 A   12/2012
CN   102851026 A   1/2013
(Continued)

OTHER PUBLICATIONS

Paulusz, "Efficient Mn(IV) Emission in Fluorine Coordination", Journal of The Electrochemical Society, Jul. 1973, vol. 120, Issue 7, pp. 942-947.
(Continued)

*Primary Examiner* — Matthew E. Hoban
*Assistant Examiner* — Lynne Edmondson

(57) ABSTRACT

A lighting apparatus is presented. The lighting apparatus includes a semiconductor light source, a color stable $Mn^{4+}$ doped phosphor and a quantum dot material, each of the color stable $Mn^{4+}$ doped phosphor and the quantum dot material being radiationally coupled to the semiconductor light source. A percentage intensity loss of the color stable $Mn^{4+}$ doped phosphor after exposure to a light flux of at least 20 $w/cm^2$ at a temperature of at least 50 degrees Celsius for at least 21 hours is ≤4%. A backlight device including the lighting apparatus is also presented.

23 Claims, 3 Drawing Sheets

US 10,230,022 B2

Page 2

(51) Int. Cl.
     *H01L 33/50* (2010.01)
     *H01L 33/52* (2010.01)
     *B82Y 20/00* (2011.01)
(52) U.S. Cl.
     CPC .............. *B82Y 20/00* (2013.01); *H01L 33/52* (2013.01); *H01L 2933/0083* (2013.01); *Y10S 977/774* (2013.01); *Y10S 977/95* (2013.01)
(58) Field of Classification Search
     CPC ... C09K 11/617; C09K 11/675; C09K 11/628; C09K 11/645; C09K 11/665; C09K 11/0838; C09K 11/02; C09K 11/664; C09K 2211/181; C09K 2211/188; Y02B 20/181
     USPC ...... 252/301.4 F, 301.4 H, 301.4 R, 301.6 F; 313/486, 503; 257/98
     See application file for complete search history.

(56) References Cited

U.S. PATENT DOCUMENTS

| | | |
|---|---|---|
| 4,479,886 A | 10/1984 | Kasenga |
| 6,103,296 A | 8/2000 | McSweeney |
| 7,270,773 B2 | 9/2007 | Manivannan et al. |
| 7,318,651 B2 | 1/2008 | Chua et al. |
| 7,358,542 B2 | 4/2008 | Radkov et al. |
| 7,422,703 B2 | 9/2008 | Yi et al. |
| 7,497,973 B2 | 3/2009 | Radkov et al. |
| 7,648,649 B2 | 1/2010 | Radkov et al. |
| 7,847,309 B2 | 12/2010 | Radkov et al. |
| 8,057,706 B1 | 11/2011 | Setlur et al. |
| 8,084,934 B2 | 12/2011 | Kim et al. |
| 8,252,613 B1 | 8/2012 | Lyons et al. |
| 8,362,685 B2 | 1/2013 | Masuda et al. |
| 8,427,042 B2 | 4/2013 | Hata et al. |
| 8,497,623 B2 | 7/2013 | Oguma et al. |
| 8,593,062 B2 | 11/2013 | Murphy et al. |
| 8,703,016 B2 | 4/2014 | Nammalwar et al. |
| 8,710,487 B2 | 4/2014 | Lyons et al. |
| 8,906,724 B2 | 12/2014 | Murphy et al. |
| 8,921,875 B2 | 12/2014 | Letoquin et al. |
| 2008/0283903 A1* | 11/2008 | Grabowski ............ B82Y 10/00 257/325 |
| 2009/0001869 A1 | 1/2009 | Tanimoto et al. |
| 2009/0103296 A1 | 4/2009 | Harbers et al. |
| 2010/0090585 A1 | 4/2010 | Seto et al. |
| 2010/0091215 A1 | 4/2010 | Fukunaga et al. |
| 2011/0069490 A1 | 3/2011 | Liu |
| 2011/0186887 A1* | 8/2011 | Trottier ................... H01L 33/50 257/98 |
| 2011/0215348 A1 | 9/2011 | Trottier et al. |
| 2011/0291113 A1 | 12/2011 | Chamberlin |
| 2012/0153330 A1 | 6/2012 | Tsutsui |
| 2012/0256125 A1 | 10/2012 | Kaneyoshi et al. |
| 2012/0305972 A1 | 12/2012 | Meyer et al. |
| 2013/0070443 A1* | 3/2013 | Pan ......................... C09K 9/02 362/84 |
| 2013/0108811 A1 | 5/2013 | Wada et al. |
| 2013/0241396 A1 | 9/2013 | Hiramatsu et al. |
| 2013/0244364 A1 | 9/2013 | Gardner et al. |
| 2013/0264937 A1 | 10/2013 | Sakuta et al. |
| 2013/0271960 A1 | 10/2013 | Hong et al. |
| 2014/0048817 A1 | 2/2014 | Gardner et al. |
| 2014/0246689 A1 | 9/2014 | Luo et al. |
| 2014/0264418 A1 | 9/2014 | Murphy et al. |
| 2014/0327026 A1* | 11/2014 | Murphy ................... H01L 33/52 257/98 |
| 2015/0048759 A1 | 2/2015 | Jo |
| 2015/0069299 A1 | 3/2015 | Pan et al. |
| 2015/0123153 A1 | 5/2015 | Setlur |
| 2015/0221843 A1* | 8/2015 | Choi ....................... H01L 33/20 257/98 |
| 2016/0087164 A1 | 3/2016 | Kawano |
| 2016/0104821 A1* | 4/2016 | Hino ................... G02F 1/133514 362/293 |

FOREIGN PATENT DOCUMENTS

| | | |
|---|---|---|
| EP | 2629341 A1 | 8/2013 |
| GB | 1360690 A | 7/1974 |
| JP | 2013-014715 A | 1/2013 |
| JP | 2013-060506 A | 4/2013 |
| WO | 2009005035 A1 | 1/2009 |
| WO | 2009119486 A1 | 10/2009 |
| WO | 2011073951 A2 | 6/2011 |
| WO | 2013088313 A1 | 6/2013 |
| WO | 2013121355 A1 | 8/2013 |
| WO | 2013138347 A1 | 9/2013 |
| WO | 2013144919 A1 | 10/2013 |
| WO | 2013158929 A1 | 10/2013 |
| WO | 2014068440 A1 | 5/2014 |

OTHER PUBLICATIONS

Black et al., "Excitation and luminescence spectra of dipotassium hexafluoromanganate(IV)", Journal of the Chemical Society, Royal Society of Chemistry, Dalton Transactions, 1974, Issue 9, pp. 977-981.

Hu et al., "Preparation and luminescent properties of (Ca1-x,Srx)S:Eu2+ red-emitting phosphor for white LED", Journal of Luminescence, ScienceDirect, Feb. 1, 2005,vol. 111, Issue 3, pp. 139-145.

Frayret et al., "Solubility of (NH4)2SiF6, K2SiF6 and Na2SiF6 in acidic solutions", Chemical Physics Letters, Aug. 2006, vol. 427, Issue 4, pp. 356-364.

Takahashi et al., "Mn4 +-Activated Red Photoluminescence in K2SiF6 Phosphor", Journal of The Electrochemical Society, vol. 155, Issue 12, 2008, pp. E183-E188.

Bera et al., "Optimization of the Yellow Phosphor Concentration and Layer Thickness for Down-Conversion of Blue to White Light", Journal of Display Technology, vol. 6, No. 12, Dec. 2010, pp. 645-651.

Kasa et al.,"Red and Deep Red Emissions from Cubic K2SiF6:Mn4+ and Hexagonal K2MnF6 Synthesized in HF/KMnO4/KHF2/Si Solutions", Journal of The Electrochemical Society, ECS, 2012, vol. 159, issue 4, pp. J89-J95.

J. Y. Woo et al., "Highly EfficientWhite Light-emitting Diodes Based on Layered Quantum Dot-Phosphor Nanocomposites as Converting Materials", World Academy of Science, Engineering and Technology, vol. 6, May 20, 2012, 5 pages.

Murphy et al., "Method and System for Storage of Perishable Items", U.S. Appl. No. 13/665,514, filed Oct. 31, 2012, 21 pages.

Brewster et al., "Phosphor Assembly for Light Emitting Devices", U.S. Appl. No. 13/875,534, filed May 2, 2013, 19 pages.

Murphy, "Processes for Preparing Color Stable Manganese-Doped Phosphors", U.S. Appl. No. 61/868,633, filed Aug. 22, 2013, 22 pages.

Setlur et al., "LED Package With Red-Emitting Phosphors", U.S. Appl. No. 14/073,141, filed Nov. 6, 2013, 14 pages.

Liao et al.,"Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.

Murphy et al., "Processes for Preparing Color Stable Manganese-Doped Complex Fluoride Phosphors", U.S. Appl. No. 61/915,927, filed Dec. 13, 2013, 23 pages.

Nammalwar et al., "Phosphor Materials and Related Devices", U.S. Appl. No. 14/348,244, filed Mar. 28, 2014, 31 pages.

Murphy et al., "Red-Emtting Phosphors and Associated Devices", U.S. Appl. No. 14/303,020, filed Jun. 12, 2014, 23 pages.

Setlur et al., "Color Stable Red-Emitting Phosphors", U.S. Appl. No. 14/302,823, filed Jun. 12, 2014, 24 pages.

Garcia et al., "Color Stable Red-Emitting Phosphors", U.S. Appl. No. 14/302,907, filed Jun. 12, 2014, 24 pages.

Setlur et al., "LED Package With Red-Emitting Phosphors", U.S. Appl. No. 14/304,098, filed Jun. 13, 2014, 23 pages.

(56) References Cited

OTHER PUBLICATIONS

International Search Report and Written Opinion dated Jul. 14, 2014 which was issued in connection with PCT Patent Application No. PCT/US2014/027733, 10 pages.

Medic et al., "Deep-Red Emitting Mn4+ Doped Mg2TiO4 Nanoparticles", The journal of physical chemistry C, 119 (1), 2015, pp. 724-730.

Zhang et al.,"Brightly Luminescent and Color-Tunable Colloidal CH3NH3PbX3 (X =Br, I, Cl) Quantum Dots: Potential Alternatives for Display Technology",American Chemical Society, ACS Nano, 2015, 9 (4), pp. 4533-4542.

Downloaded from https://en.wikipedia.org/wiki/List_of_refractive_indices (Wikipedia-List of refractive indices, silica), website, printed Sep. 1, 2015, 5 pages.

Downloaded from http://www.dowcorning.com/content/etronics/LED.asp,"Electronic Solutions", Dow Corning, website, printed Sep. 3, 2015, 2 pages.

Ye et al., "Phosphors in phosphor-converted white light-emitting diodes: Recent advances in materials, techniques and properties", Materials Science and Engineering: R: Reports, vol. No. 71, Issue No. 1, pp. 1-34, Dec. 1, 2010.

Kim et al., "Current Issues in Quantum Dot Phosphors for Light-Emitting Diodes", Society for Information Display, vol. No. 43, Issue No. 1, pp. 936-938, Jun. 2012.

\* cited by examiner

LIGHTING APPARATUS INCLUDING COLOR STABLE RED EMITTING PHOSPHORS AND QUANTUM DOTS

CROSS REFERENCE TO RELATED APPLICATIONS

This application is a continuation-in-part of U.S. patent application Ser. No. 14/208,592 entitled "COLOR STABLE RED-EMITTING PHOSPHORS," filed on Mar. 13, 2014, which is herein incorporated by reference.

TECHNICAL FIELD

The disclosure relates generally to a lighting apparatus. More particularly, the disclosure relates to a light emitting diode (LED)-based lighting apparatus including color stable red emitting phosphors and quantum dots.

BACKGROUND

Generation of "white light" is currently achieved by so called "white light emitting diodes (white LEDs)" that are constituted by employing a near-ultraviolet (UV) or blue emitting LED in conjunction with an inorganic phosphor or a blend of inorganic phosphors. Red-emitting phosphors based on complex fluoride materials activated by $Mn^{4+}$, such as those described in U.S. Pat. Nos. 7,358,542, 7,497,973, and 7,648,649, absorb blue light strongly, and efficiently emit between about 610 nanometers and 635 nanometers with little deep red/NIR emission. Thus, the luminous efficacy and the quantum efficiency of white LEDs maximizes under blue excitation (440 nanometers-460 nanometers) as compared to other available red phosphors.

These complex fluorides can be utilized in combination with yellow-green emitting phosphors such as cerium-doped yttrium aluminum garnet $Y_3Al_5O_{12}:Ce^{3+}$ (YAG) or other garnet compositions to achieve warm white light (CCTs<5000 K on the blackbody locus, color rendering index (CRI)>80) from a blue LED, equivalent to that produced by current fluorescent, incandescent and halogen lamps. The benefits from using these complex fluoride phosphors are evident in LEDs used in LCD backlighting, where the complex fluoride phosphor is combined with an inorganic green phosphor. The emission position and full-width at half maximum (FWHM) of these complex fluoride phosphors enable a combination of high color gamut with high brightness. However, further improvements in color gamut and brightness are desirable.

BRIEF DESCRIPTION

In one aspect, the present invention relates to a lighting apparatus that includes a semiconductor light source, a color stable $Mn^{4+}$ doped phosphor and a quantum dot material, each of the color stable $Mn^{4+}$ doped phosphor and the quantum dot material being radiationally coupled to the semiconductor light source. A percentage intensity loss of the color stable $Mn^{4+}$ doped phosphor after exposure to a light flux of at least 20 w/cm$^2$ at a temperature of at least 50 degrees Celsius for at least 21 hours is ≤4%. One aspect of the specification presents a backlight device including the lighting apparatus.

In another aspect, the color stable $Mn^{4+}$ doped phosphor is prepared by a process including contacting a $Mn^{4+}$ doped phosphor at an elevated temperature with a fluorine-containing oxidizing agent in gaseous form to form the color stable $Mn^{4+}$ doped phosphor.

In yet another aspect, the present invention relates to a backlight device including a lighting apparatus as described above.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
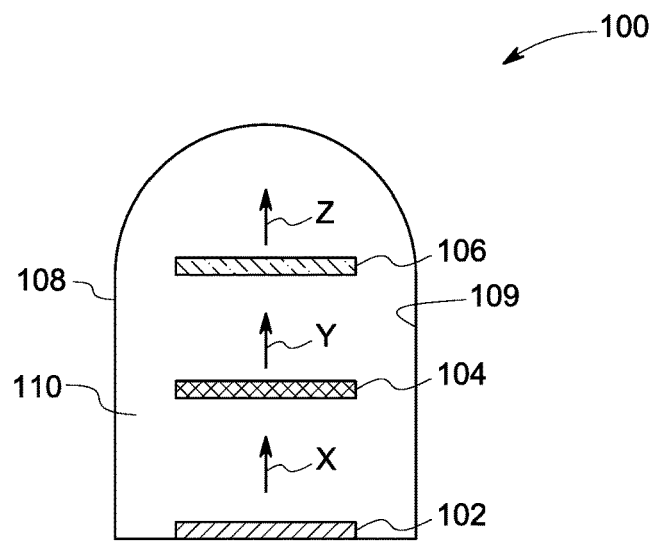
FIG. 1 is a schematic view of a lighting apparatus, in accordance with one embodiment of the invention.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" is not limited to the precise value specified. In some instances, the approximating language may correspond to the precision of an instrument for measuring the value.

Unless defined otherwise, technical and scientific terms used herein have the same meaning as is commonly understood by one of skill in the art to which this invention belongs. The terms "comprising," "including," and "having" are intended to be inclusive, and mean that there may be additional elements other than the listed elements. The terms "first", "second", and the like, as used herein do not denote any order, quantity, or importance, but rather are used to distinguish one element from another.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. As used herein, the term "disposed on" refers to layers or materials disposed directly in contact with each other or indirectly by having intervening layers or features there between, unless otherwise specifically indicated. The term "adjacent" as used herein means that the two layers or two components are disposed contiguously and are in direct contact with each other.

In the present specification, when a layer or a material is being described as "on" another layer, material or substrate, it is to be understood that the layers or the materials can either be directly contacting each other or have one or more layers, materials, or features between the layers or materials. Further, the term "on" describes the relative position of the layers or the materials to each other and does not necessarily mean "on top of" since the relative position above or below depends upon the orientation of a device to the viewer. Moreover, the use of "top," "bottom," "above," "below," and variations of these terms is made for convenience, and does not require any particular orientation of the components unless otherwise stated.

As used herein, the terms "phosphor", "phosphor composition", or "phosphor material" may be used to denote both a single phosphor as well as blends of two or more phosphors.

In some embodiments, the color stable $Mn^{4+}$ doped phosphor is a phosphor of formula I

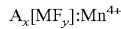

$$A_x[MF_y]:Mn^{4+} \quad \quad I$$

wherein
 A is Li, Na, K, Rb, Cs, or combinations thereof;
 M is Si, Ge, Sn, Ti, Zr, Al, Ga, In, Sc, Y, La, Nb, Ta, Bi, Gd, or combinations thereof;
 x is an absolute value of a charge of the $[MF_y]$ ion; and
 y is 5, 6 or 7.

The phosphor of formula I is a complex fluoride. More specifically, the phosphor of formula I is a manganese ($Mn^{4+}$) doped complex fluoride. In the context of the present disclosure, the terms "complex fluoride" and "doped complex fluoride" refer to a coordination compound, having a host lattice containing one coordination center, surrounded by fluoride ions acting as ligands, and charge-compensated by counter ions (A) as necessary. For example, in $K_2[SiF_6]$, the coordination center is Si and the counter ion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion.

The counter ion A in formula I is Li, Na, K, Rb, Cs, or combinations thereof, and y is 6. In certain embodiments, A is Na, K, Rb, or combinations thereof. The coordination center M in formula I is an element selected from the group consisting of Si, Ge, Ti, Zr, Hf, Sn, Al, Ga, In, Sc, Y, Bi, La, Gd, Nb, Ta, and combinations thereof. In certain embodiments, M is Si, Ge, Ti, or combinations thereof.

In the phosphor of formula I, that is manganese ($Mn^{4+}$) doped complex fluoride such as $K_2[SiF_6]:Mn^{4+}$, a doped element that is, manganese (Mn) acts as an additional coordination center, substituting a part of the coordination center, for example, Si. The doped element 'Mn' is referred to as a 'dopant' or an 'activator.' The terms "doped ion" or "activator ion", as used herein, refers to an ion (for example $Mn^{4+}$) doped in a complex fluoride that forms luminescent center and is responsible for the luminescence of the phosphor of formula I. The manganese doped phosphor of formula I $A_2(M,Mn)F_6$ may also be represented as $A_2[MF_6]$:$Mn^{4+}$. The host lattice (including the counter ions) may further modify the excitation and emission properties of the activator ion.

Examples of the phosphors of formula I include $K_2[SiF_6]$:$Mn^{4+}$, $K_2[TiF_6]$:$Mn^{4+}$, $K_2[SnF_6]$:$Mn^{4+}$, $Cs_2[TiF_6]$:$Mn^{4+}$, $Rb_2[TiF_6]$:$Mn^{4+}$, $Cs_2[SiF_6]$:$Mn^{4+}$, $Rb_2[SiF_6]$:$Mn^{4+}$, $Na_2[TiF_6]$:$Mn^{4+}$, $Na_2[ZrF_6]$:$Mn^{4+}$, $K_3[ZrF_7]$:$Mn^{4+}$, $K_3[BiF_7]$:$Mn^{4+}$, $K_3[YF_7]$:$Mn^{4+}$, $K_3[LaF_7]$:$Mn^{4+}$, $K_3[GdF_7]$:$Mn^{4+}$, $K_3[NbF_7]$:$Mn^{4+}$, $K_3[TaF_7]$:$Mn^{4+}$. In certain embodiments, the phosphor of formula I is $K_2[SiF_6]$:$Mn^{4+}$.

Other color stable phosphors that may be used in a lighting apparatus according to some embodiments of the present invention include:
 (A) $A_2[MF_5]$:$Mn^{4+}$, where A is selected from Li, Na, K, Rb, Cs, and combinations thereof and where M is selected from Al, Ga, In, and combinations thereof;
 (B) $A_3[MF_6]$:$Mn^{4+}$, where A is selected from Li, Na, K, Rb, Cs, and combinations thereof and where M is selected from Al, Ga, In, and combinations thereof;
 (C) $Zn_2[MF_7]$:$Mn^{4+}$, where M is selected from Al, Ga, In, and combinations thereof;
 (D) $A[In_2F_7]$:$Mn^{4+}$ where A is selected from Li, Na, K, Rb, Cs, and combinations thereof;
 (E) $E[MF_6]$:$Mn^{4+}$, where E is selected from Mg, Ca, Sr, Ba, Zn, and combinations thereof; and where M is selected from Ge, Si, Sn, Ti, Zr, and combinations thereof;
 (F) $Ba_{0.65}Zr_{0.35}F_{2.70}$:$Mn^{4+}$; and
 (G) $A_3[ZrF_7]$:$Mn^{4+}$ where A is selected from Li, Na, K, Rb, Cs, and combinations thereof.

The color stable phosphors are prepared by a process including contacting a $Mn^{4+}$ doped phosphor at an elevated temperature with a fluorine-containing oxidizing agent in gaseous form to form the color stable $Mn^{4+}$ doped phosphor. In some embodiments, the $Mn^{4+}$ doped phosphor and the color stable $Mn^{4+}$ doped phosphor are of formula I. That is, each of the $Mn^{4+}$ doped phosphor and the color stable $Mn^{4+}$ doped phosphor is a phosphor of formula I. It should be noted that although the $Mn^{4+}$ doped phosphor and the color stable $Mn^{4+}$ doped phosphor have the same formula, they are differentiated in terms of their color stability. The term color stable $Mn^{4+}$ doped phospor as used herein refers to a phosphor that is prepared by the process as discussed hereinbelow.

In some embodiments, a percentage intensity loss of the color stable $Mn^{4+}$ doped phosphor after exposure to a light flux of at least 20 $w/cm^2$ at a temperature of at least 50 degrees Celsius for at least 21 hours is ≤4%. The percentage intensity loss of the color stable $Mn^{4+}$ doped phosphor may refer to an intensity loss of the color stable $Mn^{4+}$ doped phosphor when subjected to a stability testing under high flux conditions, for example a flux of at least 20 $W/cm^2$. In some embodiments, the percentage intensity loss of the color stable $Mn^{4+}$ doped phosphor after exposure to a light flux of at least 20 $w/cm^2$ at a temperature of at least 50 degrees Celsius for at least 21 hours is ≤3%. In some embodiments, the percentage intensity loss of the color stable $Mn^{4+}$ doped phosphor after exposure to a light flux of at least 20 $w/cm^2$ at a temperature of at least 50 degrees Celsius for at least 21 hours is ≤1%.

The $Mn^{4+}$ doped phosphors described herein may be procured or prepared by methods as known in the art, for example through co-crystallization reaction methods by combining, for example, elemental fluorides, carbonates, and hydroxides as starting materials in hydrofluoric acid solutions. The $Mn^{4+}$ doped phosphor may be post-treated for enhancing performance and color stability properties to attain the color stable $Mn^{4+}$ doped phosphor. In some embodiments, the $Mn^{4+}$ doped phosphor is annealed, or subjected to an elevated temperature, while in contact with an atmosphere containing a fluorine-containing oxidizing agent.

The temperature at which the $Mn^{4+}$ doped phosphor is contacted with the fluorine-containing oxidizing agent may range from about 200 degrees Celsius to about 700 degrees Celsius, and in some embodiments, from about 350 degrees Celsius to about 600 degrees Celsius. In some embodiments, the temperature is in a range from about 200 degrees Celsius to about 700 degrees Celsius. In various embodiments of the present invention, the temperature is at least 100 degrees Celsius, particularly at least 225 degrees Celsius, and more particularly at least 350 degrees Celsius.

The $Mn^{4+}$ doped phosphor is contacted with the oxidizing agent for a period of time sufficient to convert it to a color stable $Mn^{4+}$ doped phosphor. Time and temperature are interrelated, and may be adjusted together, for example, increasing time while reducing temperature, or increasing temperature while reducing time. In certain embodiments, the time is at least one hour, particularly for at least four hours, more particularly at least six hours, and most particularly at least eight hours. In a specific embodiment, the $Mn^{4+}$ doped phosphor is contacted with the oxidizing agent for a period of at least eight hours and a temperature of at least 250 degrees Celsius, for example, at about 250 degrees Celsius for about four hours and then at a temperature of about 350 degrees Celsius for about four hours.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or combinations thereof. In certain embodiments, the fluorine-containing oxidizing agent is $F_2$. The amount of oxidizing agent in the atmosphere may be varied to obtain the color stable $Mn^{4+}$ doped phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In certain embodiments, the atmosphere is composed of about 20% $F_2$ and about 80% nitrogen.

The manner of contacting the $Mn^{4+}$ doped phosphor with the fluorine-containing oxidizing agent may not be critical and may be accomplished in any way sufficient to convert the $Mn^{4+}$ doped phosphor to a color stable phosphor having the desired properties. In some embodiments, a chamber containing the $Mn^{4+}$ doped phosphor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

Color stability and quantum efficiency of color stable $Mn^{4+}$ doped phosphors annealed in a process according to the embodiments of the present invention may be enhanced by treating the color stable $Mn^{4+}$ doped phosphor in particulate form with a saturated solution of a composition of formula II $$A_x[MF_y] \qquad \qquad II$$

wherein
A is Li, Na, K, Rb, Cs, or combinations thereof;
M is Si, Ge, Sn, Ti, Zr, Al, Ga, In, Sc, Y, La, Nb, Ta, Bi, Gd, or combinations thereof;
x is an absolute value of a charge of the $[MF_y]$ ion; and
y is 5, 6 or 7,
in aqueous hydrofuoric acid, as described in U.S. Pat. No. 8,252,613. The temperature at which the color stable $Mn^{4+}$ doped phosphor is contacted with the solution ranges from about 20 degrees Celsius to about 50 degrees Celsius. The period of time required to contact the color stable $Mn^{4+}$ doped phosphor ranges from about one minute to about five hours, and in some embodiments, from about five minutes to about one hour. Concentration of hydrofluoric acid in the aqueous HF solutions ranges from about 20% w/w to about 70% w/w, and in some embodiments, from about 40% w/w to about 70% w/w. Less concentrated solutions may result in lower yields of the color stable $Mn^{4+}$ doped phosphor.

The amount of manganese in the color stable $Mn^{4+}$ doped phosphors of formula I may range from about 1.2 mol percent (mol %) (about 0.3 weight percent (wt %)) to about 16.5 mol % (about 4 wt %). In some embodiments, the amount of manganese may range from about 2 mol % (about 0.5 wt %) to 13.4 mol % (about 3.3 wt %), or from about 2 mol % to 12.2 mol % (about 3 wt %), or from about 2 mol % to 11.2 mol % (about 2.76 wt %), or or from about 2 mol % to about 10 mol % (about 2.5 wt %), or from about 2 mol % to 5.5 mol % (about 1.4 wt %), or from about 2 mol % to about 3.0 mol % (about 0.75 wt %).

Luminescent QDs may have unique characteristics such as wide absorption spectra, high luminescence efficiency (~90-95%), low light scattering and size tunable emission properties. For example, QDs can generate a range of colors that may be unattainable with conventional phosphors. These advantages may allow use of QDs in lighting applications to improve the performance, efficiency and color rendering properties of such lighting applications, for example light emitting diode (LED)-based lighting systems. QDs may be used in LEDs for liquid crystal display (LCD) backlight devices due to their narrow emission full width at half maximum.

A QD material may serve as a down-converting luminescent material in converting light emitted by LEDs into light in the visible or infrared regions. As used herein, the term "quantum dots (QDs)" refers to luminescent nanoparticles (or light emitting nanoparticles) composed of a semiconductor material having a quantum confinement effect. The luminescent characteristics of the QDs may be determined by their composition and particle dimensions. Thus, the emission band of given QDs can be controlled by changing the particle size of the luminescent nanoparticles. For example, cadmium selenide (CdSe) QD having a particle size of 2 nanometers emits blue light and CdSe QD having a particle size of 10 nanometers emits red light.

In some embodiments, the QD material includes luminescent nanoparticles having a dimension in a range from about 1 nanometer (nm) to about 20 nanometers. In some embodiments, the luminescent nanoparticles have a dimension in a range from about 5 nm to about 15 nm. In some embodiments, at least 90 percent of the luminescent nanoparticles have dimension in the range of from about 1 nm to about 20 nm. In some embodiments, at least 90 percent of the luminescent nanoparticles have a dimension in the range of from about 5 nm to about 15 nm. The term "dimension" includes length, width, and diameter, dependent upon the shape of the nanoparticle. The luminescent nanoparticles may have shape of a sphere, a cube, a rod, a wire, a disk, dot-in-rod, or multi-pods.

In one embodiment, the QD material includes a semiconductor material selected from the group consisting of group II-VI compounds, group III-V compounds, group IV-VI compounds and combinations thereof. Non-limiting examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof Group III-V compounds may be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof.

In some other embodiments, the QD material includes luminescent nanoparticles including group I-III-VI2 chalcopyrite-type semiconductor selected from the group consisting of CuInS$_2$, CuInSe$_2$, CuGaS$_2$, CuGaSe$_2$, AgInS$_2$, AgInSe$_2$, AgGaS$_2$, AgGaSe$_2$ and combinations thereof. In yet some other embodiments, the QD material includes luminescent nanoparticles including group I-V-VI2 semiconductor selected from the group consisting of LiAsSe$_2$, NaAsSe$_2$, KAsSe$_2$ and combinations thereof. In yet some other embodiments, the QD material includes luminescent nanoparticles including group IV-VI compound semiconductor such as SbTe. In certain embodiments, the semiconductor material is selected from the group consisting of InP, CuInS$_2$, CuInSe$_2$, CdTe, CdSe, CdSeTe, AgInS$_2$, AgInSe$_2$ and combinations thereof. In some embodiments, the semiconductor material is selected from the group II-VI, III-V, I-III-V and IV-VI compound semiconductors, as described above, and further including one or more dopants. The dopant may be selected from Mn, Ag, Zn, Eu, S, P, Cu, Ce, Tb, Au, Pb, Tb, Sb, Sn and Tl.

In one embodiment, the QD material may include luminescent nanoparticles including a core-shell configuration. The core may include a first semiconductor material and a shell may include a second semiconductor material, wherein the shell is disposed over at least a portion of a surface of the core. The semiconductor nanoparticle having a core-shell configuration is also referred to as a "core-shell" nanoparticle. The core-shell nanoparticles may include a core having formula DX, where D can be cadmium, zinc, magnesium, mercury, aluminum, gallium, indium, thallium, or combinations thereof, and X can be oxygen, sulfur, selenium, tellurium, nitrogen, phosphorus, arsenic, antimony, or combinations thereof. Examples of materials suitable for use as nanoparticle cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, or combinations including any of the foregoing, including ternary and quaternary alloys. The shell may be a semiconductor material having a composition that is the same as or different from the composition of the core. The shell may include a coating of a semiconductor material on a surface of the semiconductor nanoparticle core. The shell may include a semiconductor material selected from the group consisting of group II-VI compounds, group II-V compounds, group III-VI compounds, group III-V compounds, group IV-VI compounds, group I-III-VI compounds, group II-IV-VI compounds, group II-IV-V compounds, as described above, alloys including any of the foregoing, or combinations including any of the foregoing, including ternary and quaternary alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, or combinations including any of the foregoing.

In some embodiments, the QD material may include different types of luminescent nanoparticles, such as combinations of two or more of aforementioned nanoparticles. The term "different types" may relate to different geometries as well as to different chemistries of semiconductor materials. In some embodiments, the QD material includes luminescent nanoparticles that include green light emitting nanoparticles, yellow light emitting nanoparticles, orange light emitting nanoparticles, or combinations thereof. In certain embodiments, the QD material includes green light emitting QD material, i.e. luminescent nanoparticles that emit in the green range. In some embodiments, the QD material emits in a wavelength range between about 515 nm and about 550 nm. These QD materials may be useful in LEDs for liquid crystal display (LCD) backlights. In lighting embodiments, a combination of green-emitting QDs (wavelength range between about 515 nm and about 540 nm) and yellow-emitting QDs (wavelength range between about 560 nm and about 590 nm) may be beneficial for a high color rendering in combination with the color stable Mn$^{4+}$ doped phosphor.

In one embodiment, cadmium free QDs may be desirable. In a certain embodiment, the luminescent nanoparticles include group III-V semiconductor. An example include InP based quantum dots, such as a core-shell InP—ZnS QDs. The terms "InP quantum dot" or "InP-based quantum dot" refer to "bare" InP QDs as well as core-shell InP QDs, with a shell on the InP core, such as a core-shell InP—ZnS QDs.

A schematic representation of an LED-based lighting apparatus is shown in FIG. 1. As shown in the Figure, a lighting apparatus 100 includes an LED light source 102, a color stable Mn$^{4+}$ doped phosphor 104 radiationally coupled to the LED light source 102 and a quantum dot (QD) material 106 radiationally coupled to the LED light source 102. The color stable Mn$^{4+}$ phosphor 104 is disposed between the LED light source 102 and the quantum dot material 106.

The term "radiationally coupled", as used herein, means that radiation from the semiconductor light source is directly or indirectly transmitted to a luminescent material, for example a color stable Mn$^{4+}$ doped phosphor or a quantum dot (QD) material, and the luminescent material emits radiation of a different wavelength. Indirect transmission of radiation means that a modified radiation (radiation of a different wavelength) may be transmitted to a luminescent material after interacting with one or more other luminescent materials. For example, radiation from the semiconductor light source is absorbed by a first luminescent material, for example the color stable Mn$^{4+}$ doped phosphor. The first luminescent material emits radiation (modified radiation) of different color or wavelength. The radiation emitted by the first luminescent material is transmitted to a second luminescent material, for example QD material.

The light emitted by the LED light source 102 (indicated by arrow "X") may be absorbed by the color stable Mn$^{4+}$ doped phosphor 104. The color stable Mn$^{4+}$ doped phosphor 104 may emit red light (indicated by arrow "Y") that may interact with the QD material 106. The QD material may emit light of a desired color, for example green light. The light emitted by the QD material 106 combines with the red light emitted by the color stable $Mn^{4+}$ doped phosphor 104 to produce desired emission (indicated by arrow "Z"), for example, white light.

The LED light source 102, for example an LED chip may be an inorganic light emitting diode (LED) or an organic light emitting diode (OLED). The LED light source 102 may be electrically attached to an electrical source (not shown) that provides current to the LED light source 102 and thus causes it to emit radiation. The LED light source 102 may include a blue or ultraviolet emitting LED. Examples include an LED based on a nitride compound semiconductor of formula $In_iGa_jAl_kN$ (where $0 \leq i$; $0 \leq j$; $0 \leq k$ and $i+j+k=1$) having an emission wavelength greater than about 250 nm and less than about 550 nm. In some embodiments, the LED light source 102 may include a blue or ultraviolet emitting LED having a peak emission wavelength in a range from about 300 nm to about 500 nm. Although the general discussion of the exemplary structures of the lighting apparatus discussed herein is directed toward inorganic LED based light sources, it should be understood that the LED chip may be replaced by an organic light emissive structure or other radiation source, unless otherwise noted, and that any reference to an LED chip is merely representative of any appropriate radiation source. In some embodiments, the lighting apparatus may include a plurality of LED chips.

The LED light source 102, the color stable $Mn^{4+}$ doped phosphor 104 and the QD material 106 are enclosed inside a protective casing 108 (or envelope) to protect them from surrounding atmosphere. The protective casing 108 may be formed of, for example, glass or plastic. In some embodiments, the protective casing 108 contains an encapsulant 110. The encapsulant 110 may be a low temperature glass, a thermoplastic polymer, or a thermoset polymer. In some embodiments, the encapsulant 110 may be a suitable resin known in the art, for example, a silicone or epoxy resin. In some alternative embodiments, the lighting apparatus 100 may not include the protective casing 108. In these embodiments, the light source 102 is encapsulated by the encapsulant 110 without the protective casing 108. The protective casing 108 and the encapsulant 110 may be substantially transparent. As used herein, the term "substantially transparent" means that the protective casing and the encapsulant have at least about 90 percent transparency to light.

The color stable $Mn^{4+}$ doped phosphor 104 and the QD material 106 may be disposed in any suitable configuration in the lighting apparatus 100 such that the color stable $Mn^{4+}$ doped phosphor is disposed between the LED light source 102 and the QD material 106. In some embodiments, the light "X" emitted from the LED light source 102 interacts with the color stable $Mn^{4+}$ doped phosphor 104, and the light "Y" emitted from the color stable $Mn^{4+}$ doped phosphor 104 interacts with the QD material 106. In some embodiments, the color stable $Mn^{4+}$ doped phosphor 104 may be disposed in the path of the light "X" emitted from the LED light source 102.

The color stable $Mn^{4+}$ doped phosphor 104 and the QD material 106 can be deposited on the LED light source 102 by any appropriate method known in the art. In some embodiments, the color stable $Mn^{4+}$ doped phosphor 104 and the QD material 106 are disposed in form of layers. A layer may formed by mixing the luminescent material, for example the color stable $Mn^{4+}$ doped phosphor and QD material, with a polymeric binder and deposing the layer by any suitable technique known in the art. Suitable examples of polymeric binders include silicones or epoxy resins. In some alternative embodiments, at least one of the luminescent materials may be dispersed within the encapsulant 110.

Figure 2:
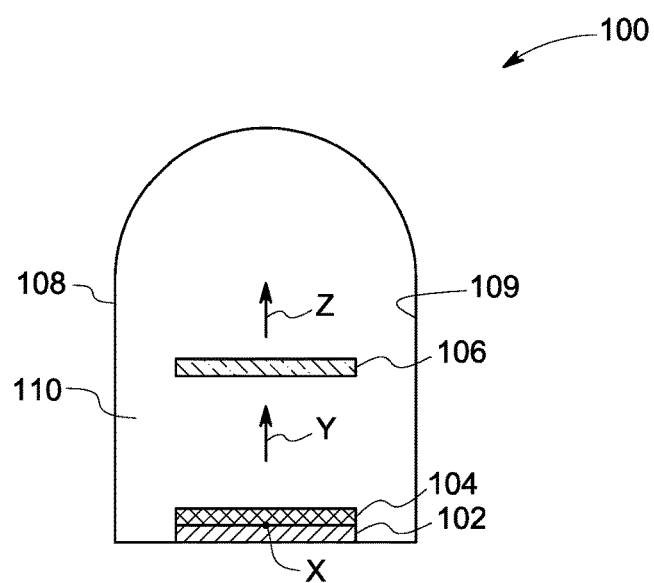
FIG. 2 is a schematic view of a lighting apparatus, in accordance with one embodiment of the invention.
Figure 3:
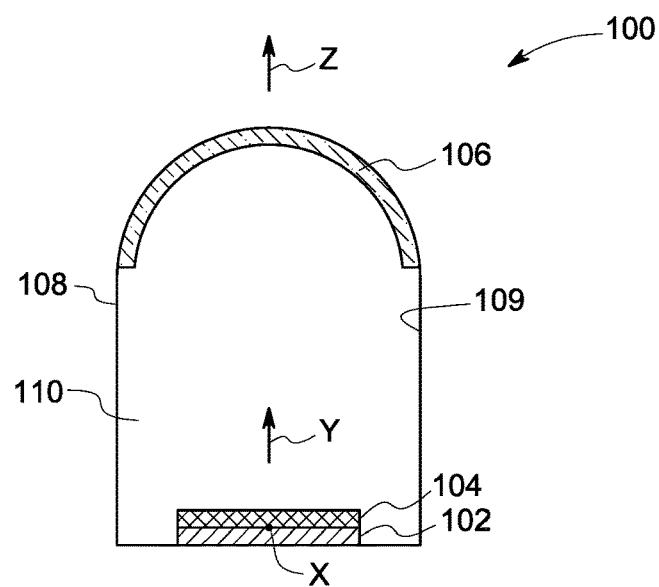
FIG. 3 is a schematic view of a lighting apparatus, in accordance with one embodiment of the invention.

FIGS. 2-3 illustrate some embodiments of a lighting apparatus 100 wherein the color stable $Mn^{4+}$ doped phosphor 104 is disposed on a surface 101 of the LED light source 102. In some embodiments, the surface 101 of the LED light source 102 is entirely covered by the color stable $Mn^{4+}$ doped phosphor 104. As illustrated in FIG. 2, the QD material 106 is disposed on the color stable $Mn^{4+}$ doped phosphor 104. FIG. 3 illustrates an embodiment of a lighting apparatus 100 wherein the QD material 106 is disposed in contact with at least a portion of an inner surface 109 of the protective casing 108.

Figure 4:
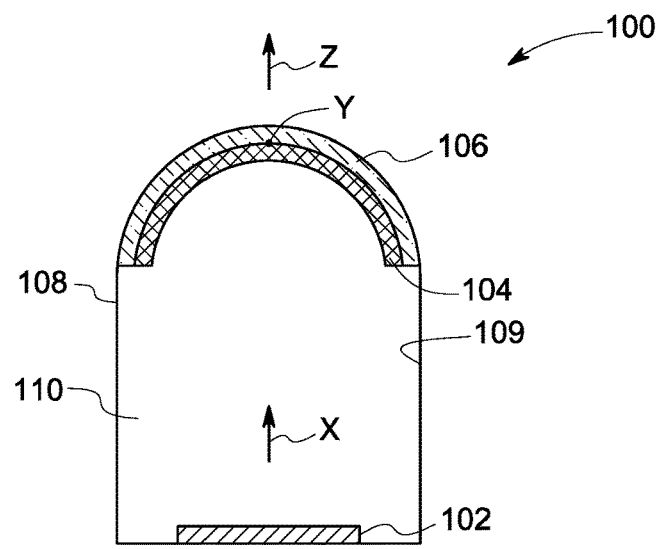
FIG. 4 is a schematic view of a lighting apparatus, in accordance with one embodiment of the invention.
Figure 5:
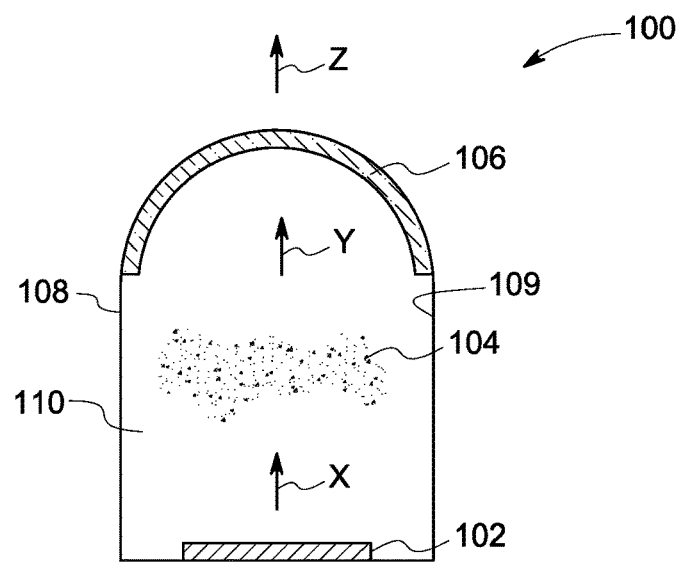
FIG. 5 is a schematic view of a lighting apparatus, in accordance with one embodiment of the invention.

FIG. 4 illustrates an embodiment of a lighting apparatus 100 wherein the QD material is disposed on at least a portion of the inner surface 109 of the protective casing 108, and the color stable $Mn^{4+}$ doped phosphor 104 is disposed in contact with the QD material 104. In some other embodiments wherein the QD material is disposed on a portion of the inner surface 109 of the protective casing 108, the color stable $Mn^{4+}$ doped phosphor 104 may be dispersed within the encapsulant 110, as depicted in FIG. 5.

In some embodiments, the lighting apparatus may be further encapsulated to reduce ingress from one or both of moisture and oxygen to increase the reliability of the apparatus. This encapsulation can be achieved by sealing the luminescent materials into fixtures that may have glass, metal or solder seals with a low ingress to moisture and oxygen.

By use of the embodiments described in the present disclosure, a lighting apparatus can be provided producing a light, for example white light having high luminosity and color rendering index (CRI) values for a low range of color temperatures of interest (2500 K to 4000 K) for general illumination. As described above, in some embodiments, a combination of the light emitted from the luminescent materials may be used to produce a desired color emission or white light. For example, in some embodiments, an LED light source may be based on a blue emitting InGaN LED chip. A color stable $Mn^{4+}$ doped phosphor of formula $K_2[SiF_6]:Mn^{4+}$ may be disposed on the blue emitting LED chip, and a QD material may be disposed on the color stable $Mn^{4+}$ doped phosphor of formula $K_2[SiF_6]:Mn^{4+}$. The color stable $Mn^{4+}$ doped phosphor of formula $K_2[SiF_6]:Mn^{4+}$ may convert the blue radiation to a complementary color that is red emission. Some of the red emitted light from the color stable $Mn^{4+}$ doped phosphor of formula $K_2[SiF_6]:Mn^{4+}$ may be absorbed by the QD material to convert the red radiation to another complementary color, for example green emission. The red and green emission from the color stable $Mn^{4+}$ doped phosphor of formula $K_2[SiF_6]:Mn^{4+}$ and the QD material may combine, and high intensity white emission may be generated.

In some embodiments, the lighting apparatus 100 may further include a plurality of particles (not shown) to scatter or diffuse the emitted light. These scattering particles may be embedded in the encapsulant 110. The scattering particles may include, for example, particles made from $Al_2O_3$ (alumina) or $TiO_2$ (titania). The scattering particles may effectively scatter the light emitted from the LED light source 102, with a minimum or negligible amount of absorption.

In addition to the color stable $Mn^{4+}$ doped phosphor, the lighting apparatus 100 may further include one or more additional materials, for example inorganic phosphors, electroluminescent polymers, and phosphorescent dyes. Additional materials emitting radiation of, for example green, blue, yellow, red, orange, or other colors may be used to customize the resulting light and produce specific spectral power distributions.

Suitable additional inorganic phosphors for use in the lighting apparatus may include, but are not limited to: $((Sr_{1-z}(Ca, Ba, Mg, Zn)_z)_{1-(x+w)}(Li, Na, K, Rb)_wCe_x)_3(Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$; $(Ca, Ce)_3Sc_2Si_3O_{12}$ (CaSiG); $(Sr,Ca,Ba)_3Al_{1-x}Si_xO_{4+x}F_{1-x}:Ce^{3+}$ (SASOF)); $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2l}$; $(Y,Gd,Lu,Sc,La)BO_3:Ce^{3l},Tb^{3l}$; $ZnS:Cu^l,Cl^-$; $ZnS:Cu^l,Al^{3l}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $-0.2\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu:Eu^{2+}$ (wherein $2\beta+4\gamma=3\mu$); $(Ba,Sr,Ca)_2Si_{5-x}Al_xN_{8-x}O_x:Eu^{2+}$ (wherein $0\leq x\leq2$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $0.5\leq u\leq1$, $0<v\leq0.1$, and $0\leq w\leq0.2$); $(Y,Lu,Gd)_{2-\varphi}Ca_\varphi Si_4N_{6-\varphi}C_{1-\varphi}:Ce^{3+}$, (wherein $0\leq\varphi\leq0.5$); $(Lu,Ca,Li,Mg,Y)$, $\alpha$-SiAlON doped with $Eu^{2+}$ and/or $Ce^{3+}$; $(Ca,Sr,Ba)SiO_2N_2:Eu^{2+},Ce^{3+}$; $\beta$-SiAlON:$Eu^{2+}$, $3.5MgO*0.5MgF_2*GeO_2:Mn^{4+}$; $(Sr,Ca,Ba)AlSiN_3:Eu^{2+}$; $(Sr,Ca,Ba)_3SiO_5:Eu^{2+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq r\leq0.2$); $Ca_{1-2s-t}Ce_s(Li,Na)_sEu_tAlSiN_3$, (where $0\leq s\leq0.2$, $0\leq f\leq0.2$, $s+t>0$); and $Ca_{1-\sigma-\chi-\phi}Ce_\sigma(Li,Na)_\chi Eu_\phi Al_{1+\sigma-\chi}Si_{1-\sigma+\chi}N_3$, (where $0\leq\sigma\leq0.2$, $0\leq\chi\leq0.4$, $0\leq\phi\leq0.2$).

Examples of electroluminescent polymers may include polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole); and polyphenylenevinylene and their derivatives. Materials suitable for use as the phosphorescent dye may include, but are not limited to, tris(1-phenylisoquinoline) iridium (III) (red dye), tris(2-phenylpyridine) iridium (green dye) and Iridium (III) bis(2-(4,6-difluorophenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE.ADS red dyes include ADS067RE, ADS068RE, ADS069RE, ADS075RE, ADS076RE, ADS067RE, and ADS077RE.

The ratio of each of the individual luminescent material, for example inorganic phosphors, QD materials, and additional luminescent materials, may vary depending on the characteristics of the desired resulting light output. The relative proportions of individual luminescent materials in the lighting apparatus may be adjusted such that when their emissions are blended, and employed in an LED lighting apparatus, there is produced visible light of predetermined x and y values on the CIE chromaticity diagram. As stated, a white light is preferably produced. In some embodiments, the resulting white light may possess an x value in the range of about 0.20 to about 0.55, and a y value in the range of about 0.20 to about 0.55. The exact identity and amount of each luminescent material in a lighting apparatus can be varied according to the needs of the end user.

Non-limiting examples of lighting apparatus or devices include devices for excitation by light-emitting diodes (LEDs) such as fluorescent lamps, cathode ray tubes, plasma display devices, liquid crystal displays (LCD's), UV excitation devices, such as chromatic lamps, backlighting devices, liquid crystal displays (LCD), plasma screens, xenon excitation lamps, and UV excitation marking systems. The list of these devices is meant to be merely exemplary and not exhaustive.

Figure 6:
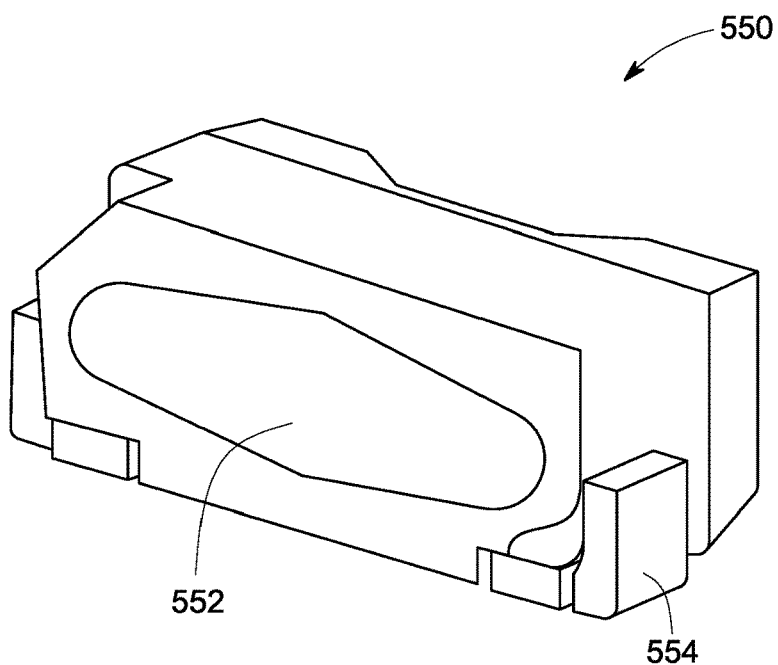
FIG. 6 is a schematic perspective view of a surface mounted device structure, in accordance with one embodiment of the invention.

In some embodiments, the lighting apparatus may be a backlight device. The backlight device may include a surface mounted device (SMD) structure 550 as illustrated in FIG. 6. The SMD may be a side-emitting type, and has a light emitting window 552 on a protruding portion of a light guiding member 554. A SMD device 550 may include an LED chip, a color stable $Mn^{4+}$ doped phosphor and a QD material in a configuration as discussed above. Examples of the backlight devices include, but are not limited to, televisions, computers, monitors, smartphones, tablet computers and other handheld devices that have a display including an LED light source.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A lighting apparatus comprising a semiconductor light source, a color stable $Mn^{4+}$ doped phosphor and quantum dots, each of the color stable $Mn^{4+}$ doped phosphor and the quantum dots being radiationally coupled to the semiconductor light source, wherein a percentage intensity loss of the color stable $Mn^{4}+$ doped phosphor after exposure to a light flux of at least 20 w/cm$^2$ at a temperature of at least 50 degrees Celsius for at least 21 hours is $\leq 4\%$ and the color stable $Mn^{4+}$ doped phosphor is $K_2SiF_6:Mn^{4+}$.

2. The lighting apparatus according to claim 1, wherein a percentage intensity loss of the color stable $Mn^{4+}$ doped phosphor is $\leq 3\%$.

3. The lighting apparatus according to claim 1, wherein the quantum dots comprise green light emitting quantum dots.

4. The lighting apparatus according to claim 1, wherein the quantum dots comprise CdSe, InP or a combination thereof.

5. The lighting apparatus according to claim 1, wherein the color stable $Mn^{4+}$ doped phosphor is disposed between the semiconductor light source and the quantum dots.

6. The lighting apparatus according to claim 5, wherein the color stable $Mn^{4+}$ doped phosphor is disposed directly on the semiconductor light source and entirely covers the semiconductor light source.

7. The lighting apparatus according to claim 6, wherein the quantum dots are disposed on the color stable $Mn^{4+}$ doped phosphor.

8. A backlight device comprising the lighting apparatus in accordance with claim 1.

9. A lighting apparatus comprising a semiconductor light source, a color stable $Mn^{4+}$ doped phosphor and quantum dots, each of the color stable $Mn^{4+}$ doped phosphor and the quantum dots being radiationally coupled to the semiconductor light source, wherein the color stable $Mn^{4+}$ doped phosphor is prepared by a process comprising contacting a $Mn^{4+}$ doped phosphor at an elevated temperature with a fluorine-containing oxidizing agent in gaseous form to form the color stable Mn$^{4+}$ doped phosphor and wherein the color stable Mn$^{4+}$ doped phosphor and the Mn$^{4+}$ doped phosphor are of formula K$_2$SiF$_6$:Mn$^{4+}$.

10. The lighting apparatus according to claim 9, wherein the fluorine-containing oxidizing agent is F$_2$.

11. The lighting apparatus according to claim 9, wherein the quantum dots comprise green light emitting quantum dots.

12. The lighting apparatus according to claim 9, wherein the quantum dots comprise CdSe, InP or a combination thereof.

13. The lighting apparatus according to claim 9, wherein the color stable Mn$^{4+}$ doped phosphor is disposed between the semiconductor light source and the quantum dots.

14. The lighting apparatus according to claim 13, wherein the color stable Mn$^{4+}$ doped phosphor is disposed directly on the semiconductor light source and entirely covers the semiconductor light source.

15. The lighting apparatus according to claim 13, wherein the quantum dots are disposed on the color stable Mn$^{4+}$ doped phosphor.

16. A backlight device comprising the lighting apparatus in accordance with claim 9.

17. The lighting apparatus according to claim 9, wherein the quantum dots are comprised of semiconductor material and a dopant.

18. The lighting apparatus according to claim 9, wherein the color stable Mn$^{4+}$ doped phosphor is K$_2$SiF$_6$:Mn$^{4+}$ and additionally comprises β-SiAlON:Eu$^{2+}$.

19. The lighting apparatus according to claim 1, wherein the quantum dots are comprised of semiconductor material and a dopant.

20. A lighting apparatus according to claim 1, wherein the quantum dots are comprised of semiconductor material and a dopant, wherein the dopant comprises at least one of Mn, Ag, Zn, Eu, S, P, Cu, Ce, Tb, Au, Pb, Tb, Sb, Sn or Tl.

21. The lighting apparatus according to claim 1, additionally comprising β-SiAlON:Eu$^{2+}$.

22. The lighting apparatus according to claim 1, wherein the semiconductor light source, the color stable Mn$^{4+}$ doped phosphor and the quantum dots are enclosed inside a protective casing.

23. The lighting apparatus according to claim 9, wherein the semiconductor light source, the color stable Mn$^{4+}$ doped phosphor and the quantum dots are enclosed inside a protective casing.

* * * * *